United States Patent [19]

Zarowin

[11] Patent Number: 4,668,366

[45] Date of Patent: May 26, 1987

[54] OPTICAL FIGURING BY PLASMA ASSISTED CHEMICAL TRANSPORT AND ETCHING APPARATUS THEREFOR

[75] Inventor: Charles B. Zarowin, Rowayton, Conn.

[73] Assignee: The Perkin-Elmer Corporation, Norwalk, Conn.

[21] Appl. No.: 790,673

[22] Filed: Oct. 23, 1985

Related U.S. Application Data

[63] Continuation-in-part of Ser. No. 637,093, Aug. 2, 1984, abandoned.

[51] Int. Cl.[4] ............... C23F 1/00; C23C 14/00
[52] U.S. Cl. ................... 204/192.1; 204/298; 156/345; 156/643
[58] Field of Search .......... 156/345, 643, 654; 204/192 R, 192 E, 298

[56] References Cited

U.S. PATENT DOCUMENTS

| | | | |
|---|---|---|---|
| 4,349,409 | 9/1982 | Shibayama et al. | 204/298 |
| 4,351,697 | 9/1982 | Shamefield et al. | 156/643 |
| 4,384,918 | 5/1983 | Abe | 156/643 |
| 4,416,725 | 11/1983 | Cuomo et al. | 156/643 |
| 4,422,407 | 12/1983 | Bessot et al. | 204/298 |
| 4,437,966 | 3/1984 | Hope | 204/298 |
| 4,439,294 | 3/1984 | Bril et al. | 204/192 E |
| 4,442,338 | 4/1984 | Yamazaki | 204/192 E |
| 4,473,437 | 9/1984 | Higashikawa et al. | 204/298 |
| 4,482,419 | 11/1984 | Tsukada et al. | 156/345 |

Primary Examiner—Terryence Chapman
Attorney, Agent, or Firm—Thomas P. Murphy; Edwin T. Grimes; Francis L. Masselle

[57] ABSTRACT

The present invention is directed to method and apparatus for figuring a surface by plasma assisted chemical transport by means of mounting the surface to be processed on at least one electrode of an R.F. driven reactor having two parallel plate electrodes; passing reactive gas through the reactor to establish gas discharge by the R.F. power; while controlling the ion energies of the reactive gas; and while controlling the removal rate of different areas of the surface by using a substantially smaller surface area electrode than said surface area so that varying the amount of time the small surface area electrode spends at each region shapes the surface. According to one aspect of the invention optical measurement of said surface is affected in quasi real time.

10 Claims, 2 Drawing Figures

OPTICAL FIGURING BY PLASMA ASSISTED CHEMICAL TRANSPORT AND ETCHING APPARATUS THEREFOR

This application is a Continuation-in-part of my pending application Ser. No. 637,093 filed Aug. 2, 1984, now abandoned, entitled "OPTICAL FIGURING BY PLASMA ASSISTED CHEMICAL TRANSPORT".

FIELD OF INVENTION

The present invention is directed to a system for removing material from a surface and, more particularly, to figuring said surface by plasma assisted chemical transport. The concept of the present invention is applicable for processing many different types of surfaces such as, for example, semiconductors, metals and insulators.

BACKGROUND OF THE INVENTION

Heretofore, various processes have been employed for figuring surfaces such as mechanically polishing, grinding, sputtering, sand blasting and ion beam bombarding, for example. The present invention is directed to improvements over such systems, particularly with respect to the rate of figuring and the control of the figuring process.

SUMMARY OF THE INVENTION

Briefly, the present invention is directed to a system for figuring a surface, such as an optical surface for example, by plasma assisted chemical transport, by means of: mounting the surface to be processed on at least one electrode of an R.F. driven reactor having two parallel plate electrodes; passing reactive gas through the reactor to establish gas discharge by the R.F. power; while controlling the ion energies of the reactive gas, and while controlling the removal rate at different areas of the surface by using a puck or smaller surface area electrode than the surface area of the work piece so that by varying the amount of time the puck, and hence the gas discharge, spends at each region the surface is shaped. In addition, according to one aspect of the invention optical measurements are taken of the optical surface in real time by means such as a positionable laser beam, for example.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this disclosure is based may readily be utilized as the basis for the designing of other systems for carrying out the several purposes of the invention. It is important, therefore that this disclosure be regarded as including such equivalent systems as do not depart from the spirit and scope of the invention. Several embodiments of the invention have been chosen for purposes of illustration and description, and are shown in the accompanying drawings forming a part of the specification.

DETAILED DESCRIPTION OF THE PRESENTLY PREFERRED EMBODIMENTS

Figure 1:
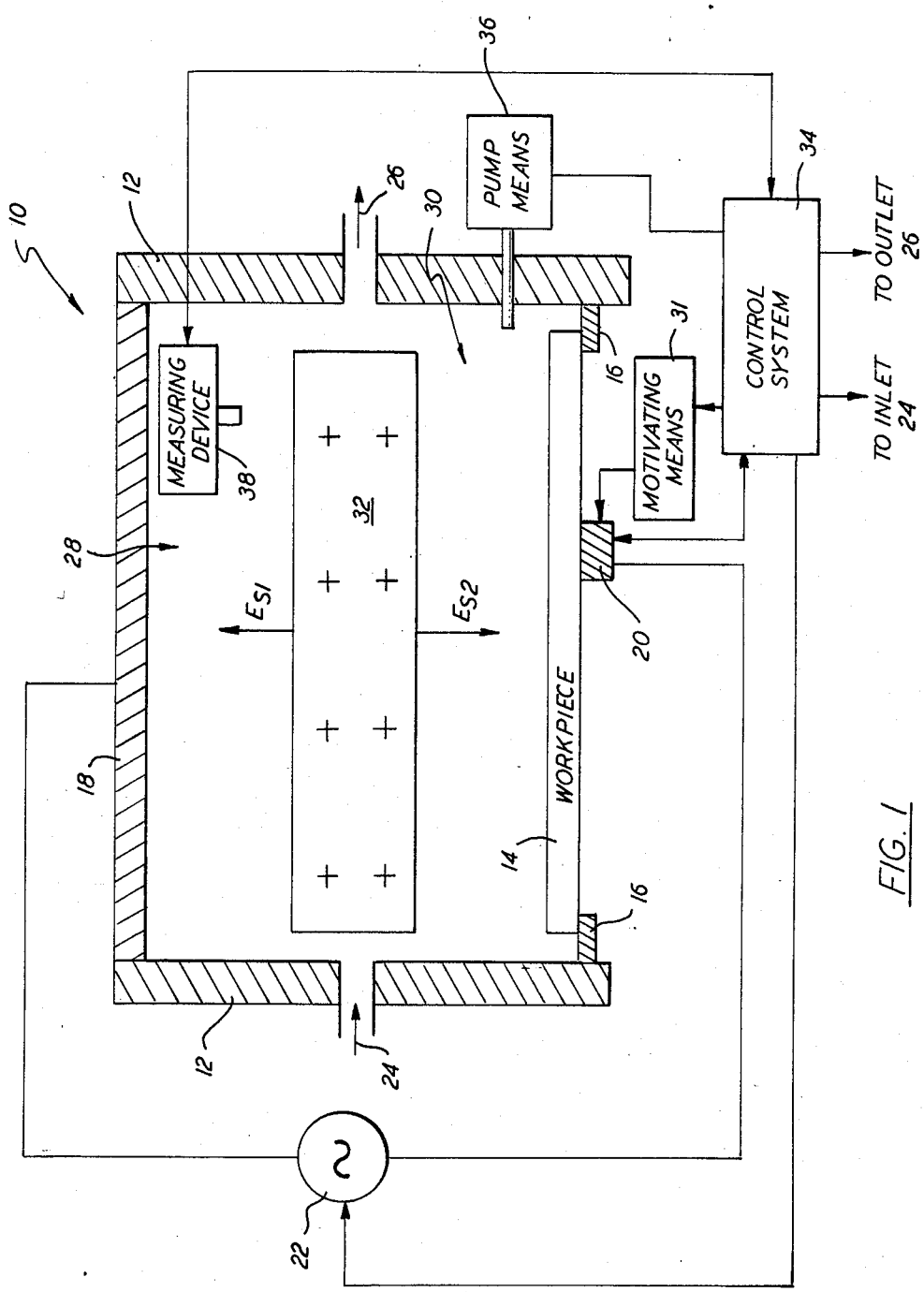
FIG. 1 is a combination schematic and block diagram of a system for figuring a surface by plasma assisted chemical vapor transport, according to the invention.

According to the invention, as best seen in FIG. 1, the system for figuring by means of plasma assisted chemical transport utilizes a closed chamber or reactor, indicated generally at 10. In normal operation the reactor is maintained in a vacuum and the operation temperature therein is preferably close to room temperature. The reactor has insulating walls 12, and the work piece surface 14 to be processed is mountable thereon as indicated at 16. A first electrode is depicted at 18 and a second electrode or puck is depicted at 20. There is an R.F. power supply 22 which drives the two electrodes 18 and 20. The reactor has a gas inlet 24 and a gas outlet 26, which will be described more fully hereinafter. The application of the R.F. power forms a plasma in the chamber 10. Thus, the reactive gas flows through the reactor in which the gas discharge is established by the R.F. power. This gas breaks down between the two electrodes into three species, i.e. negatively charged electrons which are very light but take up most of the energy, positively charged ions which are heavy like the rest of the atoms, and neutral atoms or molecules. It will be appreciated that the ions and the electrons form a small fraction of the gas, such as for example, less than one part in a million, but they take up most of the energy. Actually, the electrons because they are so much lighter, by a factor of the order of about 50,000, take up the vast majority of the energy. They act as if they are boiling. As a result, the electrons tend to migrate outwardly toward the walls and form plasma sheaths indicated at 28 and 30, leaving a positive center plasma body 32.

The process of chemical vapor transport according to the present invention is involved with removing material, not by sputtering which is like the sand blasting operation, but by a heterogeneous chemical process which is enhanced by ion bombardment. The present process has an advantage over the raw energy of sand blasting because different kinds of materials can be distinguished by the removal or etch rate. The chemical vapor transport heterogeneous reaction is as follows:

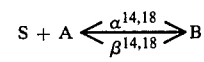

where 14 and 18 are reactor surfaces, S is a transport solid, A is a reactant which combines with S to produce a volatile compound B, with rate coefficients $\alpha$ 14,18 and $\beta$ 14,18 per unit surface area of solid S, respectively for the forward (left to right or etch) and back (deposit) reaction on surfaces 14 and 18 (surface 14 being the work piece). As indicated hereinbefore the workpiece or transport solid S could be one of many different materials such as a semiconductor, a metal or an insulator, for example. The reactant A depends on the material of the solid S and could include such reactant gases as fluorine and chlorine, and inert gases such as helium to name just a few. The volatile compound B depends on the material of the solid S and the gas A and could include such products as silicontetrachloride or gold chloride, just to name two. The effect of ion bombardment is to increase α, as if the surface temperature is increased, without actually doing so.

It will be appreciated that the solid material is being transported by combining it with a reactant to produce a flowable volatile product and, therefore, it is not necessary to raise the solid to its boiling temperature. In many instances temperatures not far from room temperature are acceptable.

Figure 2:
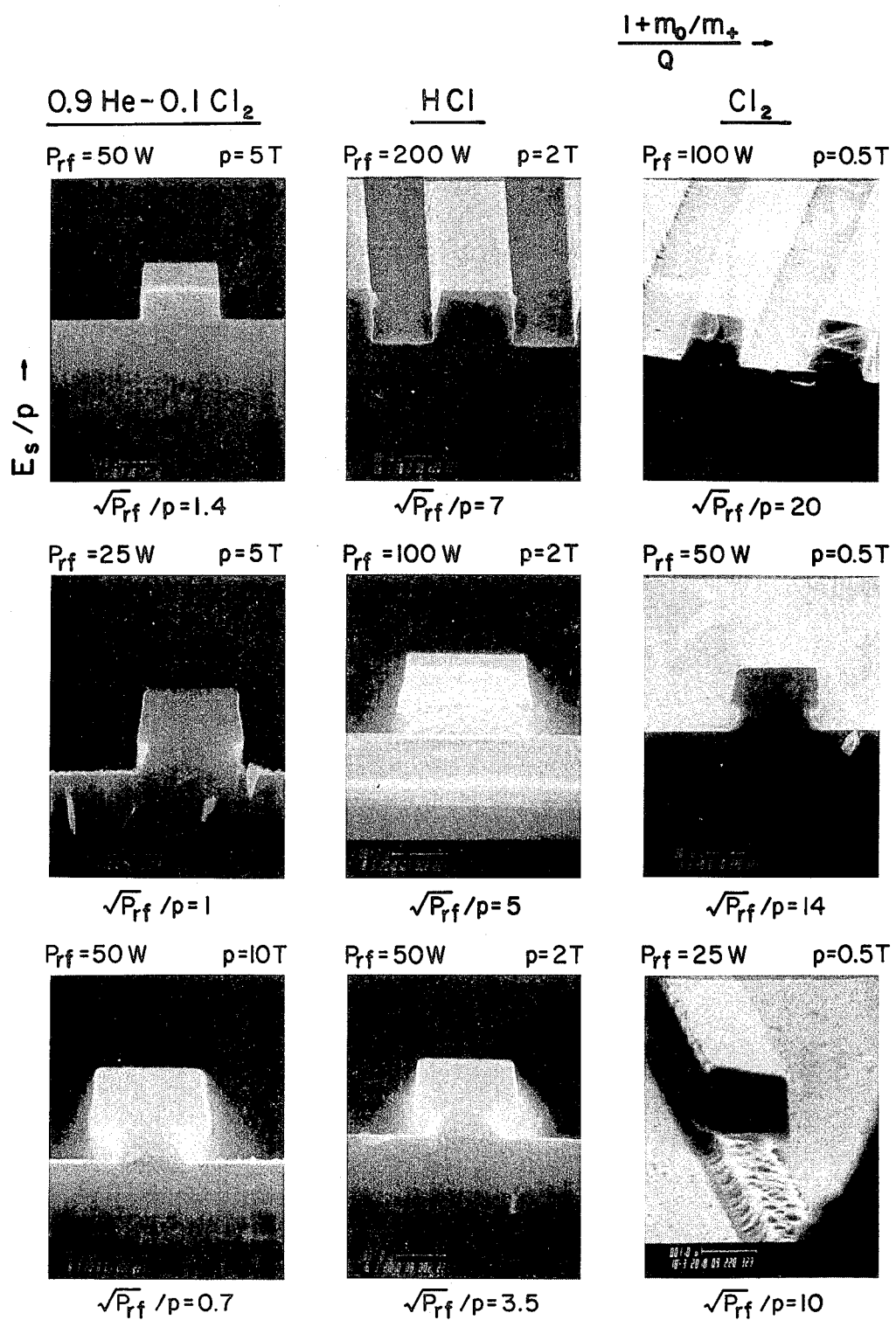
FIG. 2 shows etch profiles for doped polysilicon plasma etch in chlorine containing gas mixtures at different sheath electric field-pressure ratios.

As a general rule in a chemical reaction, if the quantity of reactant is increased the process rate increases, and an increase in pressure also causes an increase in the process rate, of the parameters being equal. Heretofore, attempts have been made to increase the process rate by merely increasing the pressure, but they failed to keep the ion energies fixed. As a result, as they raised the pressure, the ion energy went down and thereby failed to fully control the process. I have found, that by controlling the ion energies at any arbitrary pressure, the process rate can be controlled in a useful way. I have found that ion energies correspond to the power densities, not the power. As the power is increased, the plasma tends to fill the volume available so that power per unit volume does not increase similarly. However, the ion energies vary with the power densities and not the power. Therefore, since the power density controls the ion energies, the rate of material removal only linearly increases with power if the volume is kept constant. One way to control the power density is to maintain the plasma volume constant by restricting it to only the region immediately between uniform and parallel electrodes. In this case a change in power density is proportional to a change in power. This is demonstrated by the orderly relation between the etch characteristics and plasma parameters shown in FIG. 2, made simpler and more predictable because the plasma volume was fixed over a fairly wide range of R.F. powers and gas pressures. FIG. 2 shows etch profiles for doped polysilicon plasma etch in chlorine containing gas mixtures at different sheath electric field-pressure ratios, wherein $m_o/m_+$ = the neutral mass-ion ratio; Q = the cross section for the ion-neutral collisions; $P_{rf}$ = R.F. power density; W = watts; p = pressure; and T = Torr.

Referring to FIG. 1, a control system is depicted at 34, which controls the power source 22, with respect to frequency and power input. The control system also controls pump means 36 which controls the pressure or vacuum within the chamber 10. In addition, the control system 34 controls the gas flow inlet 24 and the gas flow outlet 26.

A measuring device 38, which could for example be a laser optical measurement instrument, measures the contour of the work piece surface 14 in quasi real time. For example, if the puck or electrode 20 covers 10 percent of the work piece surface then the other 90 percent of the surface could be looked at optically and monitored, because the gas discharge from there does not affect the optical measurement. In operation, the control system 34 serves through motivating means 31 to selectively position the puck 20 with respect to the surface of the workpiece 14 responsive to the measurements obtained by the measuring device 38 to thereby figure said surface according to a desired pattern. In some installations the workpiece surface is an optical surface such as one fabricated from a material such as silicondioxide, for example.

While the electrical and gas parameters vary to a large extent as a function of the geometry and type of etching desired, some typical examples of these parameters are, as follows: the range of ion energies for typical plasma etch conditions is roughly between 1 and 100 eV. For R.F. power densities of about 1 W/cm$^3$, the lower energy, 1 to 10 eV, is applicable to discharges at moderate to higher pressure, 1 to 10 Torr, and high frequency, approximately 10 MHz, or very high pressure, approximately 100 Torr, and low frequency, approximately 100 kHz. At similar power densities, the higher energy, 10 to 100 eV, applies at low pressure, approximately 10 m Torr, and high frequency approximately 10 MHz, or moderate pressure, approximately 1 Torr, and low frequency, approximately 100 kHz discharges.

Although certain particular embodiments of the invention are herein disclosed for purposes of explanation, various modification thereof, after study of this specification, will be apparent to those skilled in the art to which the invention pertains. Reference should accordingly be had to the appended claims in determining the scope of the invention.

What is claimed is:

1. A process for figuring a surface by plasma assisted chemical transport comprising the steps of:
    mounting the surface to be processed on at least one electrode of an R.F. driven reactor having two substantially parallel plate electrodes;
    passing reactive gas through said reactor to establish gas discharge by the R.F. power to thereby break down said reactive gas into ions, electrons and neutral atoms or molecules; while
    controlling the ion energies of said ions; and while
    controlling the removal rate of different areas of said surface to be processed by using a substantially smaller surface area electrode than said surface to be processed so that varying the amount of time said substantially smaller surface area electrode spends at each different area shapes the surface to be processed.

2. A process according to claim 1 wherein the surface is maintained at substantially room temperature.

3. A process according to claim 1 further comprising the step of simultaneously optically measuring and monitoring said surface in quasi real time.

4. A process according to claim 1 wherein said surface is an optical surface.

5. A process according to claim 1 further comprising the step of simultaneously controlling the pressure in said reactor.

6. Apparatus for figuring a surface by plasma assisted chemical transport comprising:
    means for mounting the surface to be processed on at least one electrode of an R.F. driven reactor having two substantially parallel electrodes;
    means for passing reactive gas through said reactor to establish gas discharge by the R.F. power to thereby break down said reactive gas into ions, electrons and neutral atoms or molecular;
    means for controlling the ion energies of said ions; and
    means for controlling the removal rate of different areas of said surface to be processed including a substantially smaller surface area electrode than said surface to be processed so that varying the amount of time said substantially smaller surface area electrode spends at each different area shapes the surface to be processed.

7. Apparatus according to claim 6 comprising means for maintaining the surface at substantially room temperature.

8. Apparatus according to claim 6 further comprising laser means for optically measuring said surface in real time.

9. Apparatus according to claim 6 wherein said surface is an optical surface.

10. Apparatus according to claim 6 further comprising means for controlling the pressure in said reactor.

* * * * *